United States Patent [19]

Geissler et al.

[11] Patent Number: 4,458,007

[45] Date of Patent: Jul. 3, 1984

[54] RADIATION POLYMERIZABLE MIXTURE CONTAINING REACTION PRODUCTS OF GLYCEROL ACRYLATES AND POLYISOCYANATES

[75] Inventors: Ulrich Geissler, Frankfurt; Heide Sprengel, Wiesbaden; Walter Herwig, Bad Soden, Manfred Hasenjaeger; Diesbaden; all of Fed. Rep. of Germany

[73] Assignee: Hoechst Aktiengesellschaft, Frankfurt, Fed. Rep. of Germany

[21] Appl. No.: 330,888

[22] Filed: Dec. 15, 1981

[30] Foreign Application Priority Data

Dec. 22, 1980 [DE] Fed. Rep. of Germany ....... 3048502

[51] Int. Cl.³ .............................................. G03C 1/68
[52] U.S. Cl. ................................... 430/284; 430/281; 430/905; 430/906; 204/159.19; 204/159.22; 528/75
[58] Field of Search ............... 430/284, 281, 905, 906; 528/75; 204/159.14, 159.19, 159.22

[56] References Cited

U.S. PATENT DOCUMENTS

| | | | |
|---|---|---|---|
| 3,701,679 | 10/1972 | Johnson et al. | 528/75 |
| 3,850,770 | 11/1974 | Juna et al. | |
| 3,954,584 | 5/1976 | Miyata et al. | 430/284 |
| 4,098,918 | 7/1978 | DeMajistre | 528/75 |
| 4,120,721 | 10/1978 | Ketley et al. | 430/284 |
| 4,198,238 | 4/1980 | Scheve | |
| 4,210,713 | 7/1980 | Sumiyoshi et al. | 430/284 |
| 4,250,248 | 2/1981 | Faust | |

FOREIGN PATENT DOCUMENTS 2030584  4/1980  United Kingdom .

Primary Examiner—Jack P. Brammer
Attorney, Agent, or Firm—Schwartz, Jeffery, Schwaab, Mack, Blumenthal & Koch

[57] ABSTRACT

A radiation-polymerizable mixture comprising a polymeric binder, a radiation-activatable polymerization initiator and a polymerizable acrylate or methacrylate ester having at least two urethane groups in the molecule, said ester being a reaction product of glycerol dimethacrylate or glycerol diacrylate and a polyisocyanate obtained by reacting a polyhydroxy compound having from two to six hydroxyl groups with a diisocyanate or a reaction product of glycerol dimethacrylate or glycerol diacrylate and a diisocyanate. The new polymerizable urethanes provide the mixture with a high light-sensitivity, good reciprocity and a low tendency to crystallize.

9 Claims, No Drawings

RADIATION POLYMERIZABLE MIXTURE CONTAINING REACTION PRODUCTS OF GLYCEROL ACRYLATES AND POLYISOCYANATES

BACKGROUND OF THE INVENTION

The present invention relates to a mixture which is polymerizable by radiation, particularly by light, and which comprises as essential constituents: a polymeric binder, a polymerization initiator which can be activated by radiation, and a free radical polymerizable acrylate or methacrylate of a polyhydric hydroxy compound having at least two urethane groups in the molecule.

Mixtures of this type are known and are primarily used for preparing radiation-sensitive, particularly light-sensitive, recording materials. Such materials are used, for example, for preparing printing plates, photoresists and relief images.

German Offenlegungsschrift No. 2,064,079 describes photopolymerizable mixtures which contain polymerizable reaction products of diisocyanates with acrylates or methacrylates of polyhydric alcohols containing at least one further free hydroxy group, e.g. hydroxyethyl methacrylate. These mixtures tend to form relatively brittle light-hardened products. They also have a limited shelf life, since the monomers have a significant vapor pressure even at only slightly elevated temperatures.

German Offenlegungsschrift No. 2,361,041 describes mixtures containing similar polymerizable compounds which have more than two urethane groups and also polyether units in the molecule. These mixtures produce only a limited crosslink density, and are relatively sensitive to atmospheric oxygen.

German Offenlegungsschrift No. 2,822,190 describes mixtures comprising high molecular weight monomers containing urethane groups which have many advantages for certain purposes, for example for the preparation of dry transferrable photoresist layers. However, even these mixtures produce products with limited crosslink densities because of their lower content of polymerizable groups per molecular weight unit.

Similar polymerizable oligourethanes are described in U.S. Pat. Nos. 3,850,770 and 4,198,238 and in European Published Application No. 9,967.

Although light-sensitive or radiation-sensitive recording materials prepared with such polymerizable compounds exhibit a number of outstanding properties, these properties are accompanied, in most cases, by certain disadvantages. Thus, although the higher molecular weight oligourethanes containing polyether groups give layers with outstanding mechanical properties in the exposed and unexposed states, the crosslink density achieved with these substances is lower than in the case of certain low molecular weight monomers. Many monomers also produce tacky layers, particularly in combination with the preferred binding agents which can be developed in aqueous alkaline media. Further, the sensitivity of most of the known materials to atmospheric oxygen is greater than is desirable.

SUMMARY OF THE INVENTION

Accordingly, it is the object of the invention to provide an improved radiation polymerizable mixture.

It is also an object of the present invention to provide an improved radiation-sensitive recording material.

A further object of the present invention is to provide a new radiation polymerizable mixture which has a high sensitivity to radiation.

Additionally, it is an object of the present invention to provide a radiation polymerizable mixture which has a good shelf life.

Yet another object of the present invention is to provide a radiation polymerizable mixture, the constituents of which exhibit a comparatively low volatility.

A still further object of the present invention is to provide a radiation polymerizable mixture which produces a high crosslink density when exposed to activating radiation.

It is also an object of the present invention to provide a radiation polymerizable mixture which exhibits a low sensitivity to atmospheric oxygen.

A further object of the present invention is to provide a radiation polymerizable mixture which exhibits good mechanical properties.

Another object of the present invention is to provide a radiation polymerizable mixture which does not produce tacky layers.

An additional object of the present invention is to provide a radiation-polymerizable mixture with a low tendency to crystallize.

Yet another object of the present invention is to provide a radiation-sensitive recording material which exhibits good reciprocity.

It is also an object of the present invention in one of its preferred aspects to provide a radiation-sensitive recording material which is developable in aqueous alkaline media.

These and other objects of the invention are achieved by providing a radiation polymerizable mixture comprising as essential constituents (a) a polymeric binder,
(b) a radiation activatable polymerization initiator, and
(c) an acrylate or methacrylate ester of a polyhydric hydroxy compound having at least two urethane groups in the molecule; said ester being a reaction product of a glycerol dimethacrylate or glycerol diacrylate and a polyisocyanate, said polyisocyanate being a diisocyanate or a reaction product of a polyhydroxy compound having from two to six hydroxyl groups with a diisocyanate.

Further aspects of the objects of the invention are achieved by providing a photopolymerizable copying material comprising a support layer and a photopolymerizable layer, said photopolymerizable layer comprising as essential constituents (a) a polymeric binder,
(b) a radiation-activatable polymerization initiator, and
(c) an acrylate or methacrylate ester of a polyhydric hydroxy compound having at least two urethane groups in the molecule, said ester being a reaction product of glycerol dimethacrylate or glycerol diacrylate and a polyisocyanate, said polyisocyanate being a diisocyanate or a reaction product of a polyhydroxy compound having from two to six hydroxyl groups with a diisocyanate.

DETAILED DESCRIPTION OF PREFERRED EMBODIMENTS

The invention relates to a mixture which is polymerizable by radiation and which comprises, as essential constituents, a polymeric binder, a polymerization initiator which can be activated by radiation, and an acrylate or methacrylate ester of a polyhydric hydroxy compound having at least two urethane groups in the molecule. The ester in the mixture of the invention is a reaction product of glycerol dimethacrylate or glycerol diacrylate and a polyisocyanate which has been obtained by reacting a polyhydroxy compound having from 2 to 6 hydroxyl groups with a diisocyanate, or a reaction product of glycerol dimethylacrylate or glycerol diacrylate and a diisocyanate.

Preferably, the polyhydroxy compound has 2 or 3 hydroxyl groups. Preferably, it is a compound corresponding to one of the following formulas:

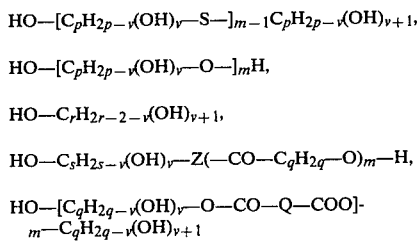

HO—[$C_pH_{2p-v}$(OH)$_v$—S—]$_{m-1}C_pH_{2p-v}$(OH)$_{v+1}$,

HO—[$C_pH_{2p-v}$(OH)$_v$—O—]$_m$H,

HO—$C_rH_{2r-2-v}$(OH)$_{v+1}$,

HO—$C_sH_{2s-v}$(OH)$_v$—Z(—CO—$C_qH_{2q}$—O)$_m$—H,

HO—[$C_qH_{2q-v}$(OH)$_v$—O—CO—Q—COO]-$_m$—$C_qH_{2q-v}$(OH)$_{v+1}$ and

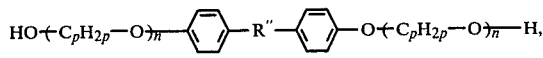

HO$+C_pH_{2p}$—O$)_n$—⟨⟩—R″—⟨⟩—O$+C_pH_{2p}$—O$)_n$—H, wherein
R″ represents O, S, CR$_2$ or SO$_2$,
Q represents a phenylene group or one of the groups $C_qH_{2q}$ and $C_qH_{2q-2}$,
R represents a hydrogen atom or a methyl group,
Z represents O or NR,
n represents an integer from 0 to 20,
m represents an integer from 1 to 40,
p represents an integer from 2 to 20,
q represents an integer from 2 to 10,
r represents an integer from 4 to 20,
s represents an integer from 2 to 10, and
v represents an integer from 0 to 4,
p, q, and s each being at least 2 greater than v, and r being at least 4 greater than v.

In general, the diisocyanate is a compound of the formula OCN—X—NCO, wherein X is a hydrocarbon radical, preferably a saturated aliphatic or cycloaliphatic hydrocarbon radical, having 2 to 20 carbon atoms.

The reaction products of the glycerol dimethacrylate are generally preferred to those of the glycerol acrylate.

The polyisocyanate obtained by reacting a polyhydroxy compound with a diisocyanate contains an average of 2 to 40, preferably 2 to 20, urethane groups per molecule.

Any radiation, the energy of which corresponds at least to that of short wavelength visible light, may be used as the electromagnetic radiation to which the mixture according to the invention is sensitive. Light of a wavelength in the range from 300 to 500 nm is preferred, but x-ray radiation, electron radiation and other corpuscular radiation, as well as laser radiation, are suitable for initiating the polymerization. In any case, the initiator system can be adapted to, or sensitized for, the desired radiation in a known manner.

Among the polyol components used for preparing the polymerizable urethanes, the polyether polyols are preferred, particularly the saturated representatives, i.e., the compounds of the formula HO—[$C_pH_{2p-v}$(OH)-$_v$—O—]$_m$H. Values from 2 to 10, particularly from 2 to 4, are preferred for p. If unsaturated polyols are used, these preferably have 4 to 10 carbon atoms per polyol unit.

For certain purposes, for example for attaining specified mechanical properties or higher light sensitivities, it can also be advantageous to use polyester polyols. These can be built up, in a known manner, from dicarboxylic acid units and polyol units, or from hydroxycarboxylic acid units. Of these, hydroxycarboxylic acids in which q represents an integer from 3 to 6 are preferred.

Polyester diols made from hydroxycarboxylic acids are customarily prepared from lactones by ring opening with a molecule of an active hydrogen compound corresponding to the formula HO—$C_sH_{2s}$—Z—H. In this formula, s preferably represents an integer from 2 to 6, and Z is preferably an oxygen atom.

The number of units in the polyester diols and polyether diols depends on the nature of these compounds and the remaining units of the molecule, on the nature of the binder and on the intended use. Polymerizable compounds having relatively long polyoxyethylene chains in the molecular are very hydrophilic and are very rapidly developed with aqueous developers. Even when less hydrophilic binders are used, monomers with such polyether groups are generally very suitable. In contrast thereto, when monomers which contain polyoxyalkylene groups having higher alkylene radicals or polyester groups are used, binders which are more hydrophilic are required if the material is to be developed without the addition of organic solvent to the developer. In most cases, compounds in which m represents an integer from 2 to 25, particularly from 3 to 15, are preferred.

Suitable diisocyanates include tolylene diisocyanates, xylylene diisocyanates, naphthylene diisocyanates, hexamethylene diisocyanate, cyclohexylene diisocyanate, diphenylmethane diisocyanate isophorone diisocyanate, 2,2,4-trimethylhexamethylene diisocyanate and the reaction product of 2 moles of tolylene diisocyanate or diphenylmethane diisocyanate and 1 mole of polytetrahydrofuran.

Examples of suitable monomeric or polymeric diols include ethylene glycol, propylene glycol, 1,4-butanediol, 2-ethyl-1,6-hexanediol, 1,10-decanediol, 1,4-bis-hydroxymethylcyclohexane, diethylene glycol, triethylene glycol, polyethylene glycols having molecular weights from 200 to about 1500; the reaction products of 4,4'-dihydroxydiphenyl ether, 4,4'-dihydroxydiphenyl sulfide, 4,4'-dihydroxy-diphenylmethane, 4,4'-dihydroxy-diphenylpropane or 4,4'-dihydroxydiphenylsulfone with 0 to 40 moles of alkylene oxide; polypropylene glycols, polytetrahydrofuran, polybutylene glycols, thiodiethylene glycol and dithiotriethylene glycol.

Examples of suitable polyester components include polycaprolactone, polybutyrolactone, polyethylene terephthalate, polypropylene adipate, polybutylene adipate and polyethylenebutylene sebacate. Polyester polyols having molecular weights in the range of about 500 to 3,000 are generally very suitable.

Apart from the preferred diols, compounds having 2 to 6 aliphatic hydroxy groups can generally be used. Examples of suitable monomeric compounds include glycerol, trimethylolpropane, pentaerithritol, dipentaerithritol and sorbitol. Suitable polymeric polyhydroxy compounds include polyester polyols, such as the lactone polyesters described in U.S. Pat. No. 3,169,945; the polyester condensation polymers with terminal hydroxy groups described in U.S. Pat. No. 3,641,199; the hydroxy group containing polyesters described in U.S. Pat. No. 3,931,117; block copolymers of polyethers and polyesters having terminal hydroxy groups; caprolactone polyols and polysiloxane polyols.

The preparation of the polymerizable diurethanes or polyurethanes is carried out in a known manner, for example as described in U.S. Pat. No. 3,297,745, in German Offenlegungsschrift No. 2,064,079 or in German Offenlegungsschrift No. 2,822,190.

For the preparation of the glycerol diester, 1 mole of glycidyl acrylate or glycidyl methacrylate is first reacted with 1 mole of acrylic acid or methacrylic acid. One mole of this reaction product is then reacted with 1 equivalent of polyisocyanate. In this process, the polyisocyanate, which preferably is a diisocyanate, may be either monomeric or a reaction product of an excess of monomeric diisocyanate with a polyol. In the latter case, the polyol component is prereacted with a desired excess of a diisocyanate. As a rule, homologous polymer mixtures are obtained thereby. The non-uniformity of the molecular weights of the monomers obtained therefrom leads to products which are highly viscous and virtually non-crystallizable.

In addition to the new monomers described above, the mixtures of the invention may contain minor amounts, i.e. less than 50%, preferably less than 20% relative to the total monomer content, of known monomers, particularly acrylates or methacrylates of polyhydric alcohols, which optionally may also contain urethane groups. The total quantity of polymerizable compounds is generally from about 20 to about 80, preferably about 30 to about 70, weight percent of the non-volatile constituents of the mixture.

A number of substances are suitable as photoinitiators. Suitable photoinitiators include benzoin, benzoin ether, polynuclear quinones such as 2-ethylanthraquinone; acridine derivatives such as 9-phenyl-acridine, 9-p-methoxyphenyl-acridine; 9-acetylamino-acridine and benz(a)acridine; phenazine derivatives such as 9,10-dimethyl-benz(a)phenazine, 9-methyl-benz(a)phenazine and 10-methoxy-benz(a)phenazine; quinoxaline derivatives such as 6,4',4''-trimethoxy-2,3-diphenyl-quinoxaline, 4',4''-dimethoxy-2,3-diphenyl-5-aza-quinoxaline, and quinazoline derivatives. In general, the photoinitiators are added in an amount from about 0.1 to 20 weight percent relative to the non-volatile constituents of the photopolymerizable mixture.

A number of soluble organic polymers can be used as the binder. Suitable binding agents include polyamides, polyvinyl esters, polyvinyl acetals, polyvinyl ethers, polyacrylates, polymethacrylates, polyesters, alkyd resins, polyacrylamide, polyvinyl alcohol, polyethylene oxide, polydimethylacrylamide, polyvinylpyrrolidone, polyvinylmethylformamide and polyvinylmethylacetamide, as well as copolymers of the monomers which form the listed homopolymers. Natural substances or modified natural substances, such as gelatines and cellulose ethers, are also suitable as binding agents.

Binding agents which are particularly advantageous are those which are soluble, or at least swellable, in aqueous alkaline solutions, since layers comprising such binding agents can be developed with the preferred aqueous alkaline developers. Binders of this type may, for example, contain the following groups: —COOH, —PO$_3$H$_2$, —SO$_3$H, —SO$_2$NH$_2$, —SO$_2$—NH—CO— and the like. Examples of such binders include: maleate resins, polymers of β-methacryloyloxy-ethyl-N-(p-tolylsulfonyl)-carbamate and copolymers of these and similar monomers with other monomers, styrene/maleic anhydride copolymers, copolymers of methylvinyl ether and maleic anhydride or maleic acid esters or half esters, methyl methacrylate/methacrylic acid copolymers and copolymers of methacrylic acid, alkyl methacrylates and methyl methacrylate and/or styrene, acrylonitrile, etc., as described in German Offenlegungsschriften Nos. 2,064,080 and 2,363,806. Copolymers of styrene and maleic anhydride or maleic acid esters or half esters, optionally in combination with copolymers of methyl vinyl ether and maleic acid half esters, are particularly preferred.

In general, the quantity of binder amounts to 20 to 80, preferably 30 to 70, weight percent of the constituents of the mixture.

In addition to monomers, binding agents and photoinitiators, the photopolymerizable mixture may optionally also contain stabilizers or inhibitors for preventing dark polymerization of the monomers, hydrogen donors, wetting agents, plasticizers, sensitometric regulators, dyes and colorless or colored pigments.

Aliphatic polyethers are generally used as hydrogen donors. Optionally, this function can also be assumed by the binder or by the polymerizable monomer if these substances have labile hydrogen atoms.

It may be advantageous to substantially isolate the photopolymerizable layer of a photopolymerizable copying material prepared from the mixture from the action of atmospheric oxygen during the light polymerization, particularly to prevent continuing diffusion of atmospheric oxygen into the layer. This is normally particularly important if exposure is effected by projection or with laser radiation without a vacuum copying frame. If the mixture is used in the form of thin copying layers, it may be advantageous to apply a suitable covering film which has a low oxygen permeability. The cover film may be self-supporting and can be removed before developing the copying layer. Polyester films, for example, are suitable for this purpose. The covering film may also be composed of a material which dissolves in the developer liquid or which can be removed, at least at the non-hardened points, during the development. Examples of materials suitable for this purpose include waxes, polyvinyl alcohol, polyphosphates, sucrose, etc.

The mixtures of the invention produce photopolymerizable layers with a high light-sensitivity. This is also the case when a covering layer which acts as an oxygen shield is omitted. Even without a covering layer, the layers show no tendency to tackiness and, in the exposed state, are stable to alkaline developers and acidic alcohol fountain solutions. In addition, the new polymerizable urethanes with polyglycol units promote the aqueous/alkaline development, without adversely affecting the developer resistance. Printing plates having photopolymerizable layers containing such polymerizable urethanes can be developed by immersion in a tray filled with developer.

The preparation of light-sensitive materials using the mixtures of the invention may be effected in a known manner. Thus, the mixture can be taken up in a solvent, and the resulting solution or dispersion can be applied to the intended support as a film by casting, spraying, dipping or roller application, and thereafter dried.

The nature of the support depends on the intended use of the light-sensitive material. For the preparation of flat printing plates, aluminum which preferably carries an anodically produced porous oxide layer is generally used. The aluminum may advantageously be mechanically, chemically or electrolytically roughened before anodization. Anodization may be effected in a known manner, for example in sulfuric acid and/or phosphoric acid, preferably under conditions such that an oxide layer having a layer weight of about 0.5 to 10 $g/m^2$ is obtained.

Before the application of the light-sensitive layer, the oxide layer is advantageously subjected to a pretreatment to improve the printing behavior, particularly the hydrophilicity, for example using silicates or polyvinyl phosphonic acid.

In addition to aluminum and aluminum alloys, steel, zinc, copper, nickel, chrome-steel, or chrome-plated copper, silicon dioxide layers or doped oxide layers which have been thermally grown or deposited on silicon, synthetic polymer films such as films of polyethylene terephthalate or cellulose acetate, or sieve printing supports such as perlon gauze or nickel sieves, can also be used as supports.

The formation of images on the copying materials is effected conventionally, for example by contact exposure through a transparent original. Customary light sources, such as carbon arc lamps, xenon lamps, mercury high-pressure lamps doped with metal halides, and the like, may be used in this process. Images can also be produced using laser light, for example using an argon ion laser.

Exposed copying materials are developed conventionally, by washing away the unexposed regions of the layer with a developer. The composition of the developer depends on the nature and solubility of the light-sensitive layer. Suitable developers include organic solvents or solvent mixtures; water which may contain small quantities of organic solvents or wetting agents; and in particular aqueous alkaline solutions which may contain buffer salts such as alkali metal phosphates or silicates, organic solvents, wetting agents, dyestuffs and other customary additives. Developers which are free of organic solvents are preferred.

The mixtures of the invention are particularly suitable for use in the form of a presensitized copying material on a suitable support for the photomechanical preparation of offset printing plates. They are also suitable for the preparation of dry-resist films, relief images, sieve printing templates and color-test films. Additionally, it is possible to use them as liquid photoresists. They are also useful as quick curing coating compositions, teeth filling compositions, adhesives, and for preparing solid, heat stable molded articles.

The following, non-limiting examples illustrate embodiments of the mixture of the invention and their use for the preparation of photopolymerizable copying materials. Unless otherwise indicated, percentages and proportions are expressed on a weight basis.

EXAMPLE 1

Electrochemically roughened and anodized aluminum which had an oxide layer of 2 $g/m^2$ and which had been pretreated with an aqueous solution of polyvinylphosphonic acid was used as a support for printing plates. The above-described support was spin coated with a solution comprising:

- 2 parts styrene/maleic anhydride copolymer partly esterified with alkanol and having an average molecular weight of 20,000 and an acid number of about 200.
- 2 parts of the diurethane described below,
- 0.125 part 9-phenyl-acridine and
- 0.05 part blue dyestuff obtained by coupling 2,4-dinitro-6-chloro-benzene diazonium salt with 2-methoxy-5-acetylamino-N-cyanoethyl-N-hydroxyethyl-aniline in
- 25 parts butanone and
- 12 parts butyl acetate.

The coated plate was thereafter dried in a circulating air drying oven for 2 minutes at 100° C. A layer weight of 3.7–4 $g/m^2$ was obtained.

The resulting printing plate was exposed for 40 seconds, under a 13-step exposure wedge with density increments of 0.15, by means of a 5 kW metal halide lamp, at a distance of 110 cm between the lamp and the vacuum copying frame.

The plate was then manually developed using a developer comprising:

- 3.0 parts sodium metasilicate $\times 9H_2O$,
- 0.03 part non-ionic wetting agent (coconut fatty alcohol polyoxyethylene ether having approx. 8 oxyethylene units),
- 0.003 part anti-foaming agent,
- 0.02 part nitrilotriacetic acid,
- 0.053 part strontium chloride $\times 6H_2O$, and
- 96.894 parts demineralized water.

Five completely crosslinked wedge steps were obtained.

Preparation of glycerol dimethacrylate 1282.5 g (9 moles) of glycidyl methacrylate were added dropwise with stirring over a period of 3 hours to a mixture of 860.9 g (10 moles) methacrylic acid, 21.4 g benzyltriethylammonium chloride and 5 g p-methoxyphenol at 75°–85° C. Stirring of the mixture was continued for 2 hours at 80° C. and the solution was then poured into dilute sodium bicarbonate solution and stirred for some time. The organic phase was separated and washed again with sodium bicarbonate solution. The product was dried over sodium sulfate and, after filtration, was stabilized with 15 g of p-methoxyphenol. Small portions of approx. 150 g each were fractionally distilled at 0.07 mbar and a bath temperature of about 140° C.

Boiling point (0.07 mbar) 115° C.
Yield: 1541 g = 75% of theoretical.
Partial polymerization occurs upon distillation.

| Analysis | Calculated | Found |
|---|---|---|
| Carbon | 57.89 | 57.7 |
| Hydrogen | 7.02 | 7.05 |
| OH number | 245.8 | 247.00 |
| Br number | 491.6 | 489.00 |
| Saponificaiton number | 140.00 | 135.00 |

Synthesis of the diurethane 336.4 g (2 moles) hexamethylene diisocyanate and 4 g benzoquinone in 350 g of butanone were initially introduced into a three-necked flask fitted with a stirrer, a reflux condenser equipped with a $CaCl_2$ drying tube, and a dropping funnel. After the addition of a catalyst solution composed of 0.85 g iron (III) acetyl-acetonate and 0.06 g triethylamine in 40 ml of butanone, 913 g (4 moles) of glycerol dimethacrylate in 900 g of butanone were added dropwise to the mixture at 80° C., over a period of 2.5 hours. Stirring of the mixture was continued for 2 hours at 80° C. Then 8 ml ethanol were added, and stirring was continued for an additional 1 hour at 80° C. The resulting approximately 50% strength solution of the diurethane in butanone was utilized directly for preparing the coating solution.

EXAMPLE 2

0.04 part amorphous, highly porous silicic acid having an average particle size of 8 μm was added to the coating solution described in Example 1, and the support was spin coated with this mixture to produce a coating having a layer weight of 4 g/m². Further processing of the plate was effected as described in Example 1.

Five completely crosslinked wedge steps were obtained. The resulting printing plate completed a print run of 170,000 sheets when using a conventional dampening unit, and a print run of 70,000 sheets when using an alcohol dampening unit.

EXAMPLE 3

A coating solution was prepared from:
1 part methyl methacrylate/methacrylic acid copolymer having a molecular weight of 30,000 and an acid number of 117.
1 part copolymer described in Example 1,
2 parts diurethane obtained from 2 moles glycerol dimethacrylate and 1 mole 2,2,4-trimethylhexamethylene diisocyanate,
0.125 part 9-phenyl-acridine,
0.07 part blue dyestuff described in Example 1, and
0.04 part silicic acid described in Example 2 in
28 parts butanone and
12 parts butyl acetate.

The aluminum support described in Example 1 was spin coated with this solution such that a coating with a dry layer weight of 5 g/m² was obtained.

Exposure, development and evaluation were effected as in Example 1. Four completely crosslinked wedge steps were obtained.

EXAMPLE 4

The support described in Example 1 was spin tes. It needed only to be rinsed off by spraying with water.

Synthesis of the oligourethane 336.4 g (2 moles) hexamethylene diisocyanate in 660 g of butanone were initially introduced into a three-necked flask fitted with a stirrer, a reflux condenser equipped with a drying tube, and a dropping funnel. A catalyst mixture was then added comprising 0.07 g iron (III) acetylacetonate and 0.005 g triethylamine in 5 ml butanone. Thereafter 400 g (1 mole) polyethylene glycol 400, dissolved in 330 g butanone, were added dropwise to the mixture at 70° C., over a period of 1.5 hours. The mixture was then heated for 2 hours at 70° C. 4 g of benzoquinone and 5 ml of the above-described catalyst solution were added to the mixture, and a solution of 456.5 g (2 moles) of the glycerol dimethacrylate described in Example 1, in 330 g of butanone, was added dropwise at 70° C., over a period of 1 hour. After the completion of the addition, the mixture was stirred for an additional 2.5 hours at 70° C. 20 ml of ethanol were then added, and the mixture was heated again at 70° C. for 1 hour.

After distilling away the solvent, the mixture was extracted by shaking with 5 l of water. Formation of an emulsion was prevented by adding approx. 200 ml 15% strength NaCl solution. After the mixture had been taken up in 500 ml of ethyl acetate, it was again washed with 5 l of water. The organic phase was separated, diluted with a further 2.1 l ethyl acetate and dried over sodium sulfate. An oleaginous product was precipitated by adding 1.4 l gasoline (boiling range 40°–80° C.), and this product was taken up in 2 l of ethyl acetate and again precipitated with 1.1 l gasoline. After stabilization with 2.4 g (approx. 0.3%) p-methoxyphenol, the remaining solvent was removed at a bath temperature of approx. 40° C. Yield: 674 g=56.5% of theoretical.

The molecular weight distribution of the resulting product was determined by gel chromatography against the diurethane described in Example 1, as a comparison. The analysis indicated a proportion of about 15% homologs having 4 urethane groups, about 24% homologs having 6 urethane groups, and about 58.5% homologs having more than 6 urethane groups.

EXAMPLE 5

A plate coated as in Example 4 was provided with a polyvinyl alcohol covering layer having a layer weight of 4 g/m² after drying.

Samples of this plate were exposed for 5, 10, 20 or 40 seconds, respectively, through a 13-step exposure wedge with density increments of 0.15, by means of a metal halide lamp, and were thereafter developed with the developer solution described in Example 1.

In a further experiment, samples of the same plate, were heated at 100° in a circulating air drying oven for 5 seconds after exposure and then developed.

The following table shows that the layer has a strictly reciprocal behaviour and that the subsequent heating step results in a significant increase in the number of completely crosslinked wedge steps. The number of almost completely crosslinked wedge steps is indicated in brackets.

| Wedge steps | Exposure time (seconds) | | | |
|---|---|---|---|---|
| | 5 | 10 | 20 | 40 |
| without subsequent heating | 3 (4) | 5 | 7 (8) | 9 (10) |
| with subsequent heating | 9 (10) | 10 (11) | 12 (13) | 13 |

Comparison of the number (9 (10)) of completely crosslinked wedge steps of the printing plate having a covering layer which was exposed for 40 seconds with the number (7; Example 4) of crosslinked steps of the correspondingly exposed plate without a covering layer shows that the layer exhibits only slight sensitivity to oxygen.

Layers comprising other monomers (for example trimethylolethane triacrylate) crosslink substantially less when subject to the influence of oxygen (that is to say when not provided with a covering layer) than when protected with a covering layer (4 wedge steps without a covering layer and 9 wedge steps with a covering layer, at an exposure time of 40 seconds).

EXAMPLE 6

Supports as described in Example 1 were spin coated with solutions having the following composition such that a coating with a layer weight of 2.5 g/m² was obtained after drying:

2 parts copolymer described in Example 1,
1.6 parts of one of the following compounds:
  (a) oligourethane obtained from 2 moles glycerol dimethacrylate, 2 moles hexamethylene diisocyanate and 1 mole polyethylene glycol 200,
  (b) analogous oligourethane produced with 1 mole of polyethylene glycol 300,
  (c) analogous oligourethane produced with 1 mole of polyethylene glycol 600,
  (d) analogous oligourethane produced with 1 mole of polyethylene glycol 1000,
  (e) analogous oligourethane produced with 1 mole of dipropylene glycol, or
  (f) analogous oligourethane produced with 1 mole of polypropylene glycol 400,
0.5 part of 9-phenyl-acridine and
0.05 part azo dyestuff described in Example 1, in
23 parts butanone,
12 parts butyl acetate and
12 parts ethylene glycol monomethyl ether.

The resulting plates were exposed for 40 seconds and were developed with the developer solution described in Example 1.

The following numbers of completely crosslinked wedge steps were obtained:

| Monomer | Development time (seconds) | Wedge steps |
|---|---|---|
| a | 15 | 5 (6) |
| b | 10 | 6 (7) |
| c | 5 | 8 (9) |
| d | <5 | 4 (5) |
| e | 45 | 3 (4) |
| f | 30 | 4 |

EXAMPLE 7

Coating solutions were prepared from:
2 parts copolymer described in Example 1,
2 parts of one of the following monomers:
  (a) 2,2-bis-[4-(2-acryloyloxy-propoxy)-phenyl]propane,
  (b) trimethylolethane triacrylate,
  (c) reaction product of 1 mole of 2,2,4-trimethylhexamethylene diisocyanate and 2 moles of hydroxyethyl methacrylate,
  (d) reaction product of 1 mole triethylene glycol, 2 moles 2,2,4-trimethylhexamethylene diisocyanate and 2 moles of hydroxyethyl methacrylate,
  (e) diurethane from Example 1, or
  (f) oligourethane from Example 4,
0.125 part 9-phenyl-acridine and
0.05 part azo dyestuff from Example 1 in
27 parts butanone and
12 parts butyl acetate.

Electrolytically roughened and anodized aluminum was spin coated with the solutions such that in each case a coating having a dry layer weight of 3.5 g/m² was obtained. The plates were exposed for 10, 20 and 40 seconds, and were then manually developed for 90 seconds with the developer described in Example 1.

In a further experiment, the plates were stored in a circulating air drying oven for 1 hour at 100° C., and were thereafter exposed for 40 seconds and developed for 90 seconds. The results are summarized in the following table:

| Monomer | Developing time (seconds) | Exposure time (seconds) | | | 1 hour 100° C.) |
|---|---|---|---|---|---|
| | | 10 | 20 | 40 | 40 |
| | | Wedge steps | | | |
| a | 30 | 2 (3) | 3 (4) | 4 (5) | 3 |
| b | 20 | 2 | 3 | 4 | 0 |
| c | 20 | 3 (4) | 3 (4) | 4 (5) | 2 (3) |
| d | 25 | 2 | 4 | 5 | 5 |
| e | 20 | 1 | 2 | 5 | 5 |
| f | 5 | 2 (3) | 4 (5) | 6 (7) | 6 (7) |

It is apparent that the four comparison monomers (a through d) exhibit disadvantages compared to the compounds (e, f) described in this application, both with respect to development time and reciprocity and with respect to volatility (100° C. test).

EXAMPLE 8

A biaxially stretched and heat-set polyethylene terephthalate film having a thickness of 25 μm was spin coated with a solution of:

6.5 parts terpolymer of n-hexyl methacrylate, methacrylic acid and styrene (60:30:10) having an average molecular weight of approx. 35,000
5.6 parts diurethane described in Example 1,
0.2 part 9-phenyl-acridine and
0.02 part azo dyestuff from Example 1 in
25 parts butanone and
3 parts ethanol, such that a coating having a layer weight of 33 g/m² was obtained after drying at 100° C.

The resulting dry-resist film was laminated at 120° C., using a commercial laminating device, onto a laminated phenoplast plate coated with a copper film having a thickness of 35 μm, and was exposed for 20 seconds with a commercial exposure device. A lined original with line widths and spacings ranging down to 80 μm was used as the original.

After the exposure, the polyester film was removed, and the layer was developed for 90 seconds in a spray-developing apparatus using the developer solution described in Example 1.

The plate was then rinsed for 30 seconds with tap water, etched for 30 seconds in a 15% strength ammonium peroxydisulfate solution, rinsed again with water, immersed for 30 seconds in 10% strength sulfuric acid and then successively electroplated in the following electrolyte baths:

(1) for 30 minutes in a "Glanzkupfer-Bad" type copper electrolyte bath produced by the firm Schloetter of Geislingen/Steige, current density: 2.5 A/dm² metal deposit: approx. 15 μm temperature: room temperature (2) for 10 minutes in a "Norma" type nickel bath produced by the firm Schloetter of Geislinen/Steige current density: 4 A/dm² metal deposit: 10 μm temperature: 50° C.

The plate showed no infiltration or damage. It was then possible to remove the layers from the plate in 5% strength KOH solution at 50° C. and to etch away the exposed copper in the customary etching media.

EXAMPLE 9

A laminated phenoplast plate coated with a copper film having a thickness of 35 μm was spin coated with the resist solution described in Example 8, and the plate was dried to produce a coating having a layer weight of 30 g/m².

The resulting plate was exposed, developed and electroplated in a manner analogous to Example 8, except the following procedure was carried out instead of the nickel plating:

15 minutes in a "LA" type lead/tin bath produced by the firm Schloetter of Geislingen/Steige
current density: 2 A/dm²
metal deposit: 15 μm
temperature: room temperature This plate also showed no infiltration or damage, and it was possible to remove the photoresist stencil with KOH solution and to etch the plate with customary etching agents.

EXAMPLE 10

A cleaned support composed of an insulating material with a 35 μm copper coating was spin coated with a solution of:
6.5 parts terpolymer described in Example 8,
5.6 parts oligourethane described in Example 4,
0.2 part 9-phenyl-acridine and
0.02 part azo dyestuff from Example 1 in
25 parts butanone and
3 parts ethanol, such that a dry layer having a thickness of 4 μm was obtained. The layer was dried for 2 minutes at 100° C. in a circulating air drying oven. It was then exposed for 40 seconds by means of a 5 kW lamp. The lined original described in Example 8 was used as the original. After the exposure, the plate was developed for 45 seconds in a spray processor using 0.8% strength sodium carbonate solution.

The developed plate was rinsed, etched and then electroplated as follows:
(1) for 8 minutes in the "Glanzkupferbad" copper bath described in Example 8
current density: 2.5 A/dm²
metal deposit: approx. 4 μm
temperature: room temperature
(2) for 2 minutes in the "Norma" nickel bath described in Example 8
current density: 4 A/dm²
metal deposit: approx. 2 μm
temperature: 50° C.

No infiltration was apparent. It was possible to remove the photoresist stencil from the plate in 5% strength KOH solution at 50° C. and to etch away the exposed copper in the customary etching media.

EXAMPLE 11

The support described in Example 1 was spin coated with solutions having the following composition such that coatings having layer weights of 2.2 g/m² were obtained:
2 parts styrene/maleic anhydride copolymer (1:1, molecular weight 50,000) reacted with hydroxyethyl methacrylate (molecular weight of the reacted product about 80,000),
2 parts of one of the following monomers:

(a) diurethane obtained from 2 moles glycerol dimethacrylate and 1 mole hexamethylene diisocyanate,
(b) oligourethane obtained from 2 moles glycerol dimethacrylate, 2 moles hexamethylene diisocyanate and 1 mole polytetrahydrofurandiol (commercial product with a molecular weight of 1,000),
(c) oligourethane obtained from 2 moles glycerol dimethacrylate, 2 moles hexamethylene diisocyanate and 1 mole polycaprolactonediol (molecular weight 830),
(d) oligourethane obtained from 2 moles glycerol dimethacrylate, 2 moles hexamethylene diisocyanate and 1 mole polyethylene glycol 400,
(e) oligourethane obtained from 2 moles glycerol dimethacrylate, 2 moles hexamethylene diisocyanate and 1 mole of 4,4'-dihydroxydiphenylsulfone,
(f) analogous oligourethane with 1 mole of bisphenol A,
(g) analogous oligourethane with 1 mole of the reaction product of 1 mole of bisphenol A and 2 moles of ethylene oxide,
(h) analogous oligourethane with 1 mole of the reaction product of 1 mole of bisphenol A and 8 moles of ethylene oxide,
(i) analogous oligourethane with 1 mole of the reaction product of 1 mole of bisphenol A and 16 moles of ethylene oxide,
(k) diurethane obtained from 1 mole hexamethylene diisocyanate and 2 moles reaction product of 1 mole glycidyl methacrylate and 1 mole acrylic acid,
(l) diurethane obtained from 2 moles glycerol diacrylate and 1 mole hexamethylene diisocyanate, or
(m) tetraurethane obtained from 2 moles glycerol dimethacrylate and 1 mole reaction product of 2 moles tolylene diisocyanate and 1 mole polytetrahydrofurandiol (molecular weight about 2,000),
0.7 part 9-phenyl-acridine,
0.07 part azo dyestuff from Example 1,
32 parts butanone,
12 parts butyl acetate and
12 parts ethylene glycol monomethyl ether.

The plates were exposed, as in Example 1, for 40 seconds, and were developed with the developer solution described in Example 1.

The development times and the number of crosslinked wedge steps obtained are listed in the following table:

| Monomer | Development Time (seconds) | Wedge Steps |
| --- | --- | --- |
| a | 7 | 7 (8) |
| b | 7 | 10 (11) |
| c | 7 | 9 (10) |
| d | 5 | 10 |
| e | 5 | 2 (3) |
| f | >30 | 2 |
| g | >30 | 3 (4) |
| h | 7 | 8 (9) |
| i | 7 | 11 |
| k | 5 | 7 (8) |
| l | 5 | 5 (6) |
| m | 7 | 10 (11) |

EXAMPLE 12

If the binder described in Example 11 was replaced with a styrene/monoallyl maleate copolymer (molecular weight ~64,000) and the recipe was otherwise identical, 6 (7) completely crosslinked wedge steps were obtained for the monomer (a) from Example 11 and 8 (9) completely crosslinked wedge steps were obtained for the monomer (c). In both cases the development time was less than 5 seconds.

EXAMPLE 13

Coating solutions comprising:
1.6 parts copolymer described in Example 1,
0.4 part copolymer of methylvinyl ether and maleic acid monobutyl ester, having an acid number of about 260,
2 parts of one of the following monomers:
 (a) reaction product of 2 moles glycerol dimethacrylate and 1 mole hexamethylene diisocyanate,
 (b) reaction product of 3 moles glycerol dimethacrylate, 3 moles hexamethylene diisocyanate and 1 mole trimethylolethane,
 (c) reaction product of 3 moles glyceroldimethacrylate, 3 moles hexamethylene diisocyanate and 1 mole trimethylolpropane,
0.7 part 9-phenyl-acridine,
0.07 part azo dyestuff from Example 1, in
30 parts butanone,
12 parts butyl acetate and
12 parts ethylene glycol monomethyl ether
were prepared and spin coated onto electrolytically roughened and anodized aluminum, such that a coating having a layer weight of 2.5 g/m² was obtained after drying.

The plates were exposed for 40 seconds and were developed with the developer solution described in Example 1. The following numbers of completely crosslinked wedge steps were obtained:

| Monomer | Development time (seconds) | Wedge Steps |
|---|---|---|
| a | 10 | 6 (7) |
| b | 30 | 6 (7) |
| c | 35 | 5 (7) |

EXAMPLE 14

A silicon wafer bearing a 1 μm thick silicon dioxide layer was spin coated with a coating solution comprising:
6.5 parts terpolymer described in Example 8,
5.0 parts diurethane from Example 1,
0.7 part 9-phenylacridine, and
0.125 part blue dyestuff obtained by coupling 2,4-dinitro-6-chlorobenzene diazonium salt with 2-methoxy-5-acetylamino-N,N-diethyl aniline, in
30 parts butanone and
28 parts ethylene glycol monomethyl ether
such that a coating having a layer weight of 1 g/m² was obtained after drying for 10 minutes at 80° C.

The resulting sample was exposed in an exposure device for 6 seconds through a test original having structures ranging down to 1.5 μm (irradiation strength 8.4 mW/cm²) and developed in a 0.8% strength sodium carbonate solution for 45 seconds. The sample was then etched for 10 minutes at 23° C., in a mixture of 70 g of ammonium fluoride, 31 ml of 40% strength hydrofluoric acid and 105 ml of deionized water. Thereafter, the sample was decoated for 2 minutes at 110° C., in a mixture of 300 ml 98% strength sulfuric acid and 50 ml 35% strength hydrogen peroxide solution.

Sharp edged images were obtained of structures ranging down to 1.5 μm.

The foregoing embodiments of the invention have been set forth merely for illustrative purposes and are not intended to be limiting. Since modifications of the described embodiments incorporating the spirit and substance of the invention may occur to persons skilled in the art, the scope of the invention is to be limited solely with respect to the appended claims and equivalents.

We claim:

1. A radiation-polymerizable mixture consisting essentially of:
 (a) from about 20 to 80 weight percent of a polymeric binder soluble in aqueous solutions;
 (b) from about 0.1 to 20 weight percent of a radiation-activatable polymerization initiator; and
 (c) from about 20 to 80 weight percent of an acrylate or methacrylate ester of a polyhydric hydroxy compound having at least two urethane groups in the molecule;

said ester being a reaction product of glycerol dimethacrylate or glycerol diacrylate and a polyisocyanate; said polyisocyanate being
 (i) a diisocyanate;
 (ii) a reaction product of 1 mole of a trihydroxy compound and 3 moles of a diisocyanate, said trihydroxy compound corresponding to one of the following formulas:

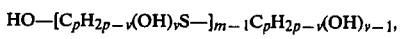

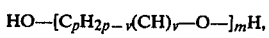

and

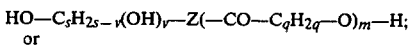

or (iii) a reaction product of a dihydroxy compound with a diisocyanate, said dihydroxy compound corresponding to one of the following formulas:

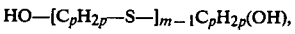

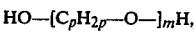

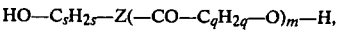

and

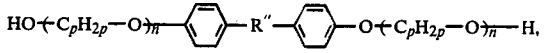

in which formulas for both of said trihydroxy compound and said dihydroxy compound, respectively:
R" represents O, S, CR₂ or SO₂,
R represents a hydrogen atom or a methyl group,
Z represents O or NR,
n represents an integer from 0 to 20,
m represents an integer from 1 to 40,
p represents an integer from 2 to 20, q represents an integer from 2 to 10,
s represents an integer from 2 to 10, and
v is 0 or 1,
p, q, and s each being at least 2 greater than v.

2. A radiation-polymerizable mixture according to claim 1 wherein said ester contains from 2 to 40 urethane groups.

3. A radiation-polymerizable mixture according to claim 1 wherein said ester is a methacrylic acid ester.

4. A radiation-polymerizable mixture according to claim 1 wherein said diisocyanate is a compound corresponding to the formula OCN—X—NCO, wherein X represents a hydrocarbon radical having from 2 to 20 carbon atoms.

5. A mixture according to claim 1 wherein said ester is a reaction product of glycerol dimethacrylate or glycerol diacrylate and a diisocyanate.

6. A mixture according to claim 5 or claim 1 wherein said diisocyanate is selected from the group consisting of tolylene diisocyanates, xylylene diiosocyanates, naphthylene diisocyanates, hexamethylene diisocyanates, cyclohexylene diisocyanate, diphenylmenthane diisocyanate, isophorone diisocyanate, 2,2,4-trimethyl-hexamethylene diisocyanate and the reaction product of two moles of tolylene diisocyanate or diphenylmethane diisocyanate and one mole of polytetrahydrofuran.

7. A mixture according to claim 1 wherein polymerizable compounds comprise from 30 to 70 weight percent of the non-volatile constituents of said mixture.

8. A mixture according to claim 1 wherein said radiation-activatable polymerization initiator comprises from about 0.1 to about 20 weight percent of the non-volatile constituents of said mixture and is selected from the group consisting of benzoin, benzoin ether, polynuclear quinones, acridine derivatives, phenazine derivatives, quinoxaline derivatives and quinazoline derivatives.

9. A mixture according to claim 1 wherein said binder is selected from the group consisting of maleate resins, polymers and copolymers of $\beta$-methacryloyloxy-ethyl-N-(p-tolyl-sulfonyl)-carbamate, styrene/maleic anhydride copolymers, copolymers of methyl vinyl ether and maleic anhydride or maleic acid esters or half esters, methyl methacrylate/methacrylic acid copolymers and copolymers of methacrylic acid, alkyl methacrylates and styrene, or acrylonitrile.

* * * * *